United States Patent
Ronkainen et al.

(10) Patent No.: US 7,515,447 B2
(45) Date of Patent: Apr. 7, 2009

(54) METHOD AND ARRANGEMENT IN INVERTER

(75) Inventors: Teemu Ronkainen, Espoo (FI); Veikko Hyvärinen, Helsinki (FI); Pekka Tiitinen, Vantaa (FI)

(73) Assignee: ABB OY, Helsinki (FI)

( * ) Notice: Subject to any disclaimer, the term of this patent is extended or adjusted under 35 U.S.C. 154(b) by 379 days.

(21) Appl. No.: 10/577,555

(22) PCT Filed: Oct. 29, 2004

(86) PCT No.: PCT/FI2004/000642

§ 371 (c)(1),
(2), (4) Date: Apr. 28, 2006

(87) PCT Pub. No.: WO2005/043618

PCT Pub. Date: May 12, 2005

(65) Prior Publication Data

US 2007/0097770 A1    May 3, 2007

(30) Foreign Application Priority Data

Oct. 30, 2003    (FI) ................... 20031580

(51) Int. Cl.
H02M 1/00       (2007.01)
(52) U.S. Cl. .................................... 363/141
(58) Field of Classification Search ............... 363/141; 361/676, 688, 690, 695, 704, 717, 722
See application file for complete search history.

(56) References Cited

U.S. PATENT DOCUMENTS

| | | | |
|---|---|---|---|
| 4,736,595 A * | 4/1988 | Kato | ............................ 62/160 |
| 5,712,802 A | 1/1998 | Kumar et al. | |
| 6,724,313 B2 * | 4/2004 | Sato et al. | .................... 340/590 |
| 6,978,628 B2 * | 12/2005 | Honda | ......................... 62/134 |

FOREIGN PATENT DOCUMENTS

| | | |
|---|---|---|
| EP | 0 792 008 A2 | 8/1997 |
| JP | 11-255442 | 9/1999 |
| JP | 2001-186775 | 7/2001 |

* cited by examiner

*Primary Examiner*—Matthew V Nguyen
(74) *Attorney, Agent, or Firm*—Buchanan Ingersoll & Rooney PC

(57) ABSTRACT

A method and arrangement in connection with an inverter that comprises several power semiconductor components and a control apparatus arranged to control them is disclosed. The method comprises the steps of determining the temperature or an electric quantity affecting the temperature of one or more power semiconductor components, determining the change of the temperature or an electric quantity affecting the temperature of one or more power semiconductor components, and controlling with the control apparatus the power semiconductor components in response to both a control quantity to generate an output voltage and the change rate of the temperature or a quantity affecting the temperature of the power semiconductor components to reduce temperature variation by slowing down the temperature increase rate as the temperature or quantity affecting the temperature increases and by slowing down the temperature decrease rate as the temperature or quantity affecting the temperature decreases.

10 Claims, 1 Drawing Sheet

METHOD AND ARRANGEMENT IN INVERTER

BACKGROUND OF THE INVENTION

The present invention relates to a method and arrangement in an inverter for the purpose of reducing the effects related to the temperature variation of semiconductor components.

An inverter is an electric device in which it is possible to generate a voltage with variable frequencies. Inverters are typically used in motors to control them at an altering frequency or when transferring electric power back to the network, in which case the inverter generates a voltage whose frequency corresponds to that of the network. Such an inverter supplying the network is generally called a network inverter.

Today, IGB transistors (Insulated Gate Bipolar Transistor, IGBT), which are fast, gate-controlled components, are typically used as power semiconductors of inventers, i.e. the switch components generating the output voltage. The current-carrying capacity of the largest IGBT components is several hundreds of amperes and their maximum voltage is thousands of volts. In inverters, switch components are used purely as switches, in which case they have two states, i.e. fully conducting and fully blocking, in practice. Changing states is done as fast as possible to avoid a concurrent voltage and current in the component.

The IGBT mentioned herein is a component made up of several parts and, at the same time, of several pieces having different thermal resistances. The semiconductor components can be considered to be formed of a baseboard, substrate, and the actual semiconductor elements, i.e. chips. The function of the baseboard is to conduct the heat generated in the component to cooling fins or the like. The substrate is on top of the baseboard and the chip is fastened thereto. It is clear that the chip as a resistive component heats up the fastest and the most due to the current running through the component. The baseboard, in turn, heats up the slowest and the least of the component parts, i.e. it has the highest temperature time constant due to cooling in part and in part to the distribution of heat to the large volume of the baseboard.

The different parts of the semiconductor components not only have different temperature time constants, but also different thermal expansion coefficients. The thermal expansion coefficient indicates the size of the expansion caused by temperature change in a piece. Because the parts of a semiconductor component are tightly together, often soldered, mechanical forces occur between them due to expansions of different sizes and strain the component and before long destroy it.

This problem of heat stress is especially big when power semiconductors are loaded in cycles. Cyclic load refers to a load that is not even, but is formed by situations in which the power semiconductor's load is high for a time and low thereafter. Such a load generates a lot of temperature variation in the power semiconductor as the temperature rises strongly during high load, i.e. current, and goes down as the load is reduced. Cyclic load ages a power semiconductor prematurely.

Examples of cyclic drives in an inverter are crane, centrifuge, and lift drives. For instance in centrifuge drives, the inverter controls the motor to rotate the centrifuge that requires a high torque to accelerate, which means a high current and a high temperature increase in the semiconductor. After acceleration, the centrifuge is rotated at operating speed, in which case the output current of the inverter decreases significantly as the required torque decreases. The semiconductor component that heated up during the acceleration now starts to cool. If the centrifuge is further slowed regeneratively, i.e. by using the motor as a generator, a high current again passes through the switch components and the components heat up. The same applies to lift and crane drives and other cyclic drives.

One current method of dimensioning drives is to do it on the basis of the semiconductor temperature variation, i.e. amplitude, caused by the cyclic load. Semiconductor manufacturers indicate the probable number of cycles endured by the semiconductor as a function of temperature variation. As the temperature variation decreases, the allowed maximum number of cycles increases.

Today, inverters, like other electric devices, are cooled actively by fans or liquid cooling. In such solutions, heat is transferred away from the device to cool the components of the device that heat up. Generally, this is done by constant cooling, in which case, despite the temperature of the power semiconductors, the cooling fan or pump operates at a constant rotation rate. In some solutions, it is also known to use cooling that changes directly according to temperature, in which case as the production of heat increases, cooling power is increased to restrict increase in temperature.

It is clear that by using a fan to cool the components, the maximum temperature of the components can be brought down. The use of a fan only does not, however, make it possible to decrease the temperature profile of the component so as to avoid the problems caused by the temperature changes especially in cyclic drives.

BRIEF DESCRIPTION OF THE INVENTION

It is an object of the present invention to provide a method and arrangement in an inverter, and an inverter so as to avoid the above-mentioned drawbacks and enable the control of the inverter in a manner that reduces the thermal stress caused by cyclic load and thus increases the service life of the inverter. This object is achieved by a method and arrangement of the invention which is characterized by what is stated in the independent claims 1 and 9. Preferred embodiments of the invention are disclosed in the dependent claims.

The invention is based on the idea that in an inverter, the losses in power semiconductor components are evened out by actively reducing at high load and increasing at low load the momentary losses in the semiconductor. The rate and size of the temperature changes of a component can be significantly restricted by the controlled change of the component losses and cooling control on the basis of the component temperature.

The solution of the invention provides the advantage that by managing the temperature of power semiconductor components, the service life of the components can be lengthened significantly especially in connection with cyclic use, in which the power semiconductors are considerably strained as a result of temperature variation when the prior art is used. In addition, by utilizing the invention, the thermal dimensioning of the devices can be made more optimal than before, i.e. there is no need to over-dimension the device. When used with an inverter, the solution of the invention has no impact of the behavior of the motor coupled to the inverter, and the motor can be loaded in a normal manner.

BRIEF DESCRIPTION OF THE FIGURES

The invention will now be described in greater detail by means of preferred embodiments and with reference to the attached drawings, in which.

DETAILED DESCRIPTION OF THE INVENTION

Figure 1:
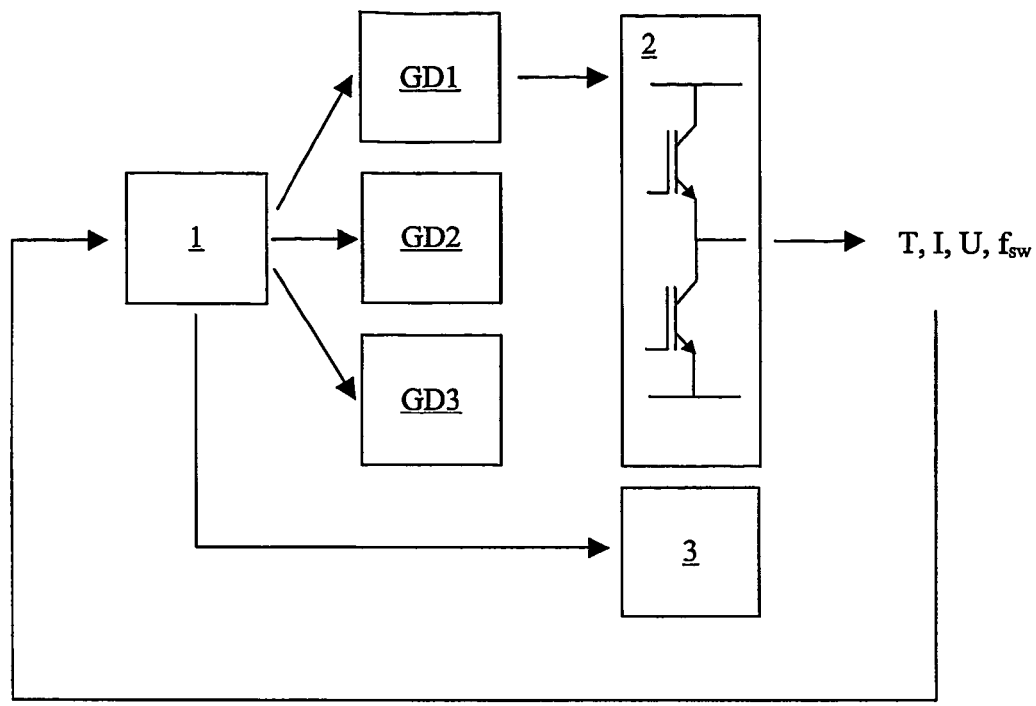
FIG. 1 shows a general block diagram of the solution of the invention.

FIG. 1 shows on a general level a block diagram of the arrangement of the invention implementing the method of the invention. The arrangement is shown in association with an inverter, and no specific target of application is shown for the inverter. Thus, it is clear that the method and arrangement can be utilized in any application using an inverter.

FIG. 1 shows how a processor element 1 controls gate drivers GD1, GD2, GD3 in accordance with a control algorithm in the processor. The gate drivers are correspondingly connected to control power semiconductors 2, of which FIG. 1 only shows two, i.e. a switch pair that typically forms one phase. In a normal three-phase system, there are three switch pairs of this type.

According to the method of the invention, the temperature T or an electric quantity affecting the temperature of one or more power semiconductor components 2 is determined. The determination of the temperature can at its simplest be done by measuring the temperature of the component with an appropriate sensor. By means of modern fast processors, the temperature can, however, be calculated quite accurately by program by using a thermal model made of the power semiconductor component, with which temperature information of different parts of the power semiconductor can be obtained in real-time. When using the thermal model, a separate sensor measuring the temperature is not needed; it is enough to measure the temperature of a reference point, for instance the baseboard.

The temperature T of the semiconductor component can be determined in the manner known per se by using the thermal model, when the size I of the current running through the semiconductor component, the size U of the voltage over the component, and the switching frequency $f_{sw}$, i.e. the number of switchings per time unit, are known. In the semiconductor components, the temperature is formed of power losses that are formed of on-state losses and switching losses. The size I of the current running through the component affects the size of the on-state losses, whereas not only the size I of the current, but also the size U of the voltage over the component and, naturally, the switching frequency $f_{sw}$ affect the size of the switching losses. According to a preferred embodiment of the invention, the determination of the temperature of the component comprises a step determining the size of the current and voltage of the component to determine the temperature by using a thermal model made of the component.

Because the temperature of the component changes as a function of the load current passing through the component, the magnitude of the temperature can be approximated to some extent by means of the load current. However, it is not possible to deduce the actual temperature in the component from the size of the current. With several torque-controlled inverters, it is possible to estimate the behavior of the temperature by the torque of the machine. This torque can reliably be calculated in the control circuits of the inverter. According to an embodiment of the invention, the torque is used to indicate a temperature change. The torque can be actual torque information provided by the machine being controlled, which is calculated from the fluxes and currents of the machine, or it can be a torque instruction given to the machine, if the machine is torque-controlled. In a corresponding manner, when the machine is current-controlled, the current instruction, or a quantity generated from the current instruction, can be used as a signal indicating a temperature change.

According to the method, the change in temperature, or in a quantity affecting it, of one or more power semiconductor components is further determined. The change in temperature can be determined for instance by storing defined temperature values into a memory located in the processor. The number of temperature values stored in the memory need not, however, be great to implement the method. Further, if instead of the actual temperature, a quantity, such as current or torque, affecting the temperature is determined, these values, too, are stored into the memory and the change in the quantity is determined.

Further, according to the method, the control apparatus 1, GD1, GD2, GD3 controls the semiconductor components 2 in response to both a control quantity to generate an output voltage and the change rate of the temperature or quantity affecting the temperature of the power semiconductor components to reduce the change rate of the temperature. The control apparatus receives in a manner known per se as input a control quantity, which may be a desired output voltage, current, or torque, for instance. The primary task of the control apparatus is naturally to make sure that the control according to the control quantity is implemented. In the solution of the invention, the control apparatus also receives as input information on the temperature change rate of the power semiconductor component or on a quantity affecting it. The control apparatus then controls the semiconductor components according to the invention in such a manner that the temperature change and the change rate are minimized.

According to a preferred embodiment of the method of the invention, the cooling element 3 of the power semiconductor components of the inverter is controlled in response to a change rate in the temperature, or a quantity affecting the temperature, of the power semiconductor components to reduce the temperature change rate. In such a case, as the temperature starts to increase significantly, the rotation rate of the cooling element 3, such as preferably a fan, is increased and cooling is thus improved to reduce the increase rate of the temperature. In a corresponding manner, as the temperature of the power semiconductor component decreases, cooling is strongly reduced or even completely stopped.

In a case where the output current of the power semiconductor component decreases significantly, the component begins to cool rapidly. In such a case, the element cooling the component is first controlled to reduce cooling power, and a program solution to increase the temperature of the semiconductor is utilized. In a program solution, the control apparatus controlling the semiconductors changes modulation in such a manner that more dissipation power is produced in the semiconductor, whereby the temperature of the component cannot decrease rapidly.

Managing the temperature profile of a power semiconductor component by program can be implemented for instance by altering the reactive current level of the load in connection with alternating current drives. Increasing the reactive current level increases the current in the component, but does not in any way affect the working characteristics of the motor serving as the load. Increasing the reactive current level is a simple programmatic procedure in which the voltage or current instruction is altered in such a manner that the magnetizing level increases.

Another alternative for managing the temperature profile by program is to increase the switching frequency that switches the output power semiconductor components to the load. As a result of increasing the switching frequency, the number of switchings in the semiconductor component per time unit increases, which in turn results in an increase in losses during switching per time unit.

In the arrangement of the invention, the control apparatus controls the output power semiconductors in response to both the control quantity and the temperature of the components. This control can be implemented by program in such a manner that the implementation of the control quantity is the primary task, after which the software affects the amounts of dissipation power of the component to control the temperature change rate. The control apparatus also controls the cooling element in such a manner that the flow of the cooling medium, such as air, produced thereby can be changed as necessary.

In many applications, the equalization of a temperature profile can be begun proactively; in other words, in such a manner that actual information on the change of temperature is not needed to start the equalization. The proactive action can be started for instance on the basis of a change in the current or voltage instruction coming to the control apparatus, or by information on a coming change in these instructions. In cyclic drives, the proactive action can be implemented even more efficiently than this, since many cyclic uses last a specific period of time. For instance, in centrifuge drives, there is often exact information available on how long the centrifuging or acceleration to centrifuging speed takes. Similarly, in lift drives, the acceleration of the lift car takes substantially the same amount of time in each case. In addition, in lift drives, the shortest possible distance of the lift is also known. In connection with lift drives, the proactive action can also be performed utilizing information on the call for the lift, since typically it takes a couple of seconds from the calling of the lift to the actual movement of the lift. It is then possible to start increasing the temperature of the inverters controlling the lift motors already before the motor requires high torque, and consequently, the temperature profile can be evened out in accordance to the invention. In lift drives, it is further possible to train the system equalizing the temperature changes to proactive action in a basic cycle, which is acceleration, constant speed, and deceleration. The distance travelled at constant speed naturally depends on the number of floors to travel, which is only known after the lift is called or when the lift is used. However, there are a limited number of possible cycles within distances of different lengths. Therefore, the control of the switching frequency of the fan and inverter can be programmed in advance for different floor distances.

On the basis of this information, it is possible to use the solution of the method and arrangement in cyclic drives in such a manner that the change rate of temperature can be minimized as efficiently as possible.

Figure 2:
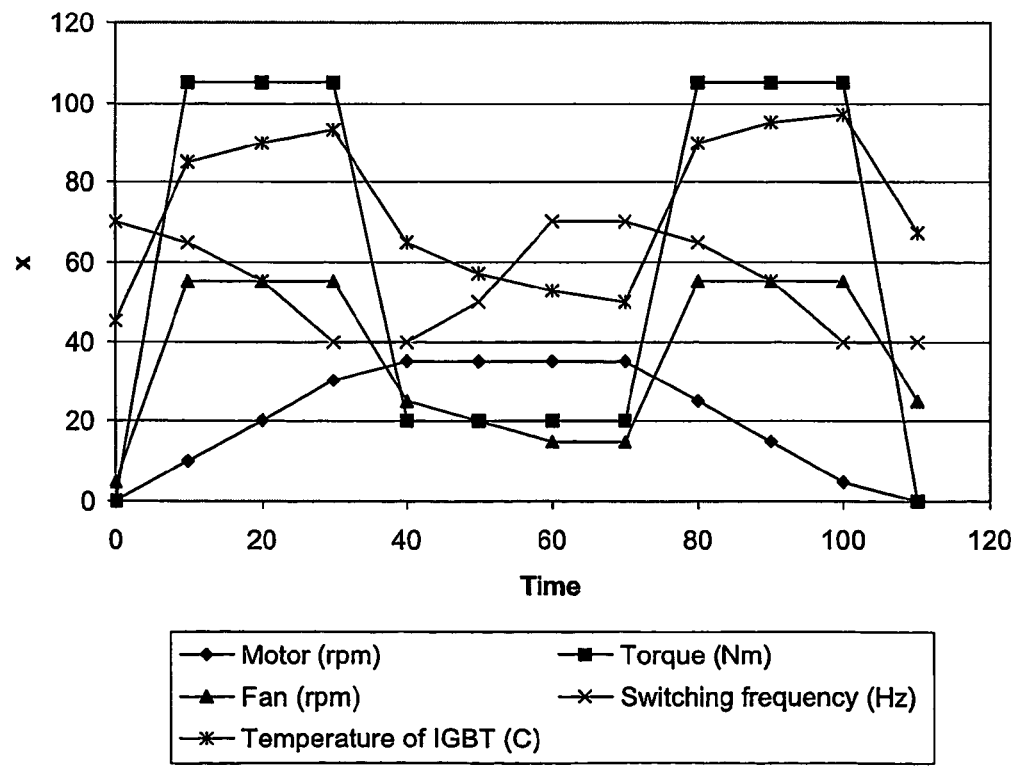
FIG. 2 shows exemplary curves of an application of the method of the invention.

An example of the use of the method is the situation shown graphically in FIG. 2, in which an inverter applies the method to control the motor in a cyclic drive, which in the example is a centrifuge drive. The figure shows the rotation rate of the drive motor, the absolute value of the produced torque, the rotation rate of the controlled fan, the switching frequency of the inverter, and the temperature of the power semiconductor components.

Initially, the centrifuge is accelerated from zero. To achieve efficient acceleration, the acceleration is performed at full torque. When an inverter produces a high torque, it is clear that the power components tend to heat up strongly. Because, to improve the strength of the components, the invention endeavors to slow down fast temperature changes, the fan is directed to provide intensive cooling that in the best possible manner restricts temperature increase in the component. This intensive cooling is shown in FIG. 2 as the rotation rate of the fan. At the same time, the inverter is controlled to use modulation that produces as low losses as possible, i.e. the switching frequency of the inverter is lowered.

When the motor is accelerated to full operating speed, the size of the required torque decreases significantly. Because the operating speed and momentary speed during acceleration are known, the decrease in torque can be anticipated for instance from the difference between the operating speed and momentary speed. Another possible way to anticipate is to determine in advance the switching frequencies used in the cycle and the rotation rates of the fan. In centrifuge drives, the moment of inertia of the load is known, so it is possible to calculate in advance the time required for acceleration on the basis of the torque produced by the machine.

When the operating speed is achieved, or when it is anticipated, the step in which the decrease rate of temperature is reduced can be started. In the example of FIG. 2, this is done in such a manner that cooling is reduced by reducing the rotation rate of the fan, and the amount of losses is acted on by program so as to increase the losses, i.e. the switching frequency of the switch components is increased. It should be remembered that real-time information is continuously obtained on the temperature of the components, which makes temperature control possible. The reduction of cooling and all programmatically utilized means can be used simultaneously, if necessary. The example of FIG. 2 uses both a controlled fan and the changing of the switching frequency. When operating the centrifuge at operating speed, the power semiconductors tend to cool fast, since the size of the current in the semiconductors also decreases rapidly.

After the centrifuging at constant rate is finished, the centrifuge is decelerated to stop it. The deceleration is often done with the motor, whereby the motor needs an opposite torque to acceleration. The power semiconductors then again tend to heat up considerably. During deceleration, low loss modulation is again used to produce as little dissipation power as possible in the components. Cooling is also increased to restrict the temperature increase rate, as shown in FIG. 2.

It should be noted that the solution of the invention is not intended to decrease the maximum temperature of the components, but only the temperature change and the change rate, which is a decisive factor in cyclic use for increasing the service life of a device utilizing power semiconductors. In other words, the method of the invention endeavors to keep the temperature of the device as constant as possible.

It should also be noted that even though the invention is above described in connection with IGBT components in particular, the solution of the invention is suited for use with all power switches used in inverters.

It is apparent to a person skilled in the art that the basic idea of the invention can be implemented in many different ways. The invention and its embodiments are thus not limited to the examples described above, but may vary within the scope of the claims.

The invention claimed is:

1. A method in connection with an inverter that comprises several power semiconductor components and a control apparatus to control them, the control apparatus being arranged to control the power semiconductor components in response to a control quantity to generate an output voltage, the method comprising the step of:

determining the temperature or an electric quantity affecting the temperature of one or more power semiconductor components, determining the change of the temperature or an electric quantity affecting the temperature of one or more power semiconductor components, and controlling with the control apparatus the power semiconductor components in response to both a control quantity to generate an output voltage and the change rate of the temperature or a quantity affecting the temperature of the power semiconductor components to reduce temperature variation by slowing down a temperature increase rate as the temperature or the electric quantity affecting the temperature increases and by slowing down a temperature decrease rate as the temperature or the electric quantity affecting the temperature decreases.

2. A method as claimed in claim 1, wherein the inverter also comprises a cooling element arranged to cool the power semiconductor components, wherein the cooling element is a controllable cooling element, and the method also comprises the step of controlling the cooling element of the power semiconductor components of the inverter in response to the change rate of the temperature or a quantity affecting the temperature of the power semiconductor components to reduce the temperature change and the change rate.

3. A method as claimed in claim 1, wherein the determination of the temperature of a power semiconductor component comprises the steps of determining the size of the current running through the component and the size of the voltage over the component, determining the number of switchings in the power semiconductor component, and calculating the temperature of the power semiconductor component on the basis of the determined size of the current and voltage and the number of switchings by using a temperature model made in advance of the power semiconductor component.

4. A method as claimed in claim 1, wherein the control of the power semiconductor components in response to the change rate of the temperature or quantity affecting the temperature of the power semiconductor components to reduce the temperature change and the change rate comprises the step of increasing the switching frequency of the power semiconductor components in response to the decrease of the temperature or quantity affecting the temperature of the power semiconductor components or decreasing the switching frequency of the power semiconductor components in response to the increase of the temperature or quantity affecting the temperature of the power semiconductor components.

5. A method as claimed in claim 1, wherein the control of the power semiconductor components in response to the change rate of the temperature or quantity affecting the temperature of the power semiconductor components to reduce the temperature change and the change rate comprises the step of increasing the reactive current level of the power semiconductor components in response to the decrease of the temperature or quantity affecting the temperature of the power semiconductor components or decreasing the reactive current level of the power semiconductor components in response to the increase of the temperature or quantity affecting the temperature of the power semiconductor components.

6. A method as claimed in claim 2, wherein the cooling element is a motor-operated fan, wherein the control of the cooling element in response to the change rate of the temperature or quantity affecting the temperature of the power semiconductor components comprises the step of increasing the rotation rate of the motor-operated fan in response to the increase of the temperature or quantity affecting the temperature of the power semiconductor components or decreasing the rotation rate of the motor-operated fan in response to the decrease of the temperature or quantity affecting the temperature of the power semiconductor components.

7. A method as claimed in claim 1, wherein the method also comprising the step of anticipating a future change in the control quantity leading to a temperature change, and taking steps to reducing the temperature change in response to the anticipation.

8. A method as claimed in claim 1, wherein the quantity affecting the temperature is a torque, current or voltage instruction, or a defined torque, current, or voltage of the machine.

9. An arrangement in connection with an inverter that comprises several power semiconductor components and a control apparatus arranged to control them, the control apparatus being arranged to control the power semiconductor components in response to a control quantity to generate an output voltage, the arrangement comprising:

means for determining the temperature or an electric quantity affecting the temperature of one or more power semiconductor components, means for determining the temperature or an electric quantity affecting the temperature of one or more power semiconductor components, and a control apparatus for controlling the power semiconductor components in response to both the control quantity to generate an output voltage and the temperature or a quantity affecting the temperature or the power semiconductor components to reduce temperature variation by slowing down a temperature increase rate as the temperature or the electric quantity affecting the temperature increases and by slowing down a temperature decrease rate as the temperature or the electric quantity affecting the temperature decreases.

10. An arrangement as claimed in claim 9, wherein the inverter also comprises a cooling element arranged to cool the power semiconductor components, wherein the cooling element is a controllable cooling element, and the arrangement also comprises means for controlling the cooling element of the power semiconductor components of the inverter in response to the change rate of the temperature or a quantity affecting the temperature of the power semiconductor components to reduce the temperature change and the change rate.

* * * * *